(12) United States Patent
Winters et al.

(10) Patent No.: US 9,385,018 B2
(45) Date of Patent: Jul. 5, 2016

(54) SEMICONDUCTOR MANUFACTURING EQUIPMENT WITH TRACE ELEMENTS FOR IMPROVED DEFECT TRACING AND METHODS OF MANUFACTURE

(71) Applicants: Samsung Austin Semiconductor, Austin, TX (US); Samsung Electronics Co., Ltd., Gyeonggi-do (KR)

(72) Inventors: Dennis Winters, Round Rock, TX (US); Victor Coots, Round Rock, TX (US); Matthew Burnham, Austin, TX (US); Daniel Thevis, Elgin, TX (US)

(73) Assignee: Samsung Austin Semiconductor, L.P., Austin, TX (US)

( * ) Notice: Subject to any disclaimer, the term of this patent is extended or adjusted under 35 U.S.C. 154(b) by 531 days.

(21) Appl. No.: 13/735,866

(22) Filed: Jan. 7, 2013

(65) Prior Publication Data

US 2014/0190278 A1   Jul. 10, 2014

(51) Int. Cl.
*G01N 19/00*   (2006.01)
*G01N 33/00*   (2006.01)
*H01L 21/677*  (2006.01)
*H01L 21/67*   (2006.01)
*H01L 21/66*   (2006.01)

(52) U.S. Cl.
CPC .... *H01L 21/67742* (2013.01); *H01L 21/67288* (2013.01); *H01L 22/12* (2013.01); *H01L 22/20* (2013.01); *Y10T 29/53022* (2015.01)

(58) Field of Classification Search
CPC ...................................................... G01N 33/00
USPC ......................................................... 73/865.8
See application file for complete search history.

(56) References Cited

U.S. PATENT DOCUMENTS

| 5,907,269 | A * | 5/1999 | Zrostlik .......................... 335/215 |
| 6,780,787 | B2 | 8/2004 | O'Donnell |
| 6,830,622 | B2 | 12/2004 | O'Donnell et al. |
| 7,300,537 | B2 | 11/2007 | O'Donnell et al. |
| 7,678,226 | B2 | 3/2010 | Saigusa et al. |
| 2006/0019409 | A1* | 1/2006 | Nelson et al. .................. 436/524 |
| 2006/0096946 | A1 | 5/2006 | Schaepkens et al. |
| 2006/0127067 | A1 | 6/2006 | Wintenberger et al. |
| 2010/0140222 | A1 | 6/2010 | Sun et al. |
| 2012/0045876 | A1* | 2/2012 | Kawahara et al. ............. 438/231 |
| 2012/0143889 | A1* | 6/2012 | Cambou et al. ................ 707/758 |

* cited by examiner

*Primary Examiner* — Hezron E Williams
*Assistant Examiner* — Rodney T Frank

(57) ABSTRACT

A semiconductor manufacturing equipment comprising trace elements and method of manufacture are disclosed. The semiconductor manufacturing equipment includes one or more components, wherein at least one component is made from an alloy comprising one or more materials and one or more rare earth elements (REEs). The alloy comprises predetermined quantities of the respective REEs. The method for manufacturing a component includes forming an alloy comprising at least one material and one or more selected rare earth elements (REEs) and building the component with the alloy.

20 Claims, 3 Drawing Sheets

SEMICONDUCTOR MANUFACTURING EQUIPMENT WITH TRACE ELEMENTS FOR IMPROVED DEFECT TRACING AND METHODS OF MANUFACTURE

TECHNICAL FIELD OF THE INVENTION

The present disclosure relates generally to semiconductor manufacturing equipments, and more specifically to semiconductor manufacturing equipments with trace elements for improved defect tracing and methods of manufacture.

BACKGROUND OF THE INVENTION

Semiconductor device fabrication, also referred to herein as "semiconductor manufacturing" or "semiconductor processing", is used to create integrated circuits for electrical and electronic devices. Semiconductor processing is a multi-step process, which includes photolithography and chemical processes during which integrated circuits are created on a wafer made of semiconductor material.

SUMMARY OF THE INVENTION

A component of semiconductor manufacturing equipment is provided. The component includes an alloy comprising one or more materials and one or more rare earth elements (REEs). The one or more REEs selected to identify a source of a defect in the semiconductor manufacturing equipment.

A semiconductor manufacturing equipment is provided. The semiconductor manufacturing equipment includes a plurality of components. At least one of the plurality of components includes one or more trace elements. The component is made from an alloy comprising one or more materials. The trace elements comprise one or more rare earth elements (REEs). The one or more REEs are selected to identify a source of a defect in the semiconductor manufacturing equipment.

A method for identifying a defect in manufacturing a component of a semiconductor manufacturing equipment is provided. The method includes identifying particles shed from at least one component of the semiconductor manufacturing equipment. The at least one component is formed from an alloy comprising at least one material and one or more selected rare earth elements (REEs). The method also includes determining whether at least one REE is present in the identified particles. The method further includes when at least one REE is present in the identified particles, identifying the at least one component as a potential defect source based on the at least one REE.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a better understanding of the disclosure, reference is now made to the detailed description of the disclosure along with the accompanying figures in which corresponding numerals in the different figures refer to corresponding parts and in which.

DETAILED DESCRIPTION OF THE INVENTION

FIGS. 1 through 6, discussed below, and the various embodiments used to describe the principles of the present disclosure are by way of illustration only and should not be construed in any way to limit the scope of the disclosure. Those skilled in the art will understand that the principles of the present disclosure may be implemented in any suitably arranged manner.

Figure 1:
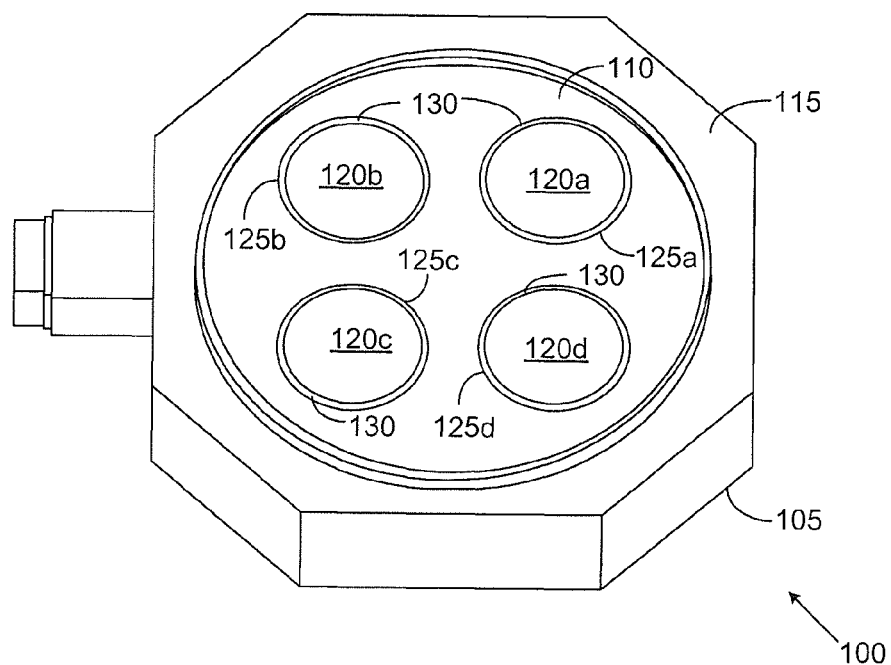
FIG. 1 illustrates a semiconductor manufacturing chamber according to embodiments of the present disclosure.

FIG. 1 illustrates an exemplary semiconductor manufacturing chamber 100 according to embodiments of the present disclosure. The semiconductor manufacturing chamber 100 of FIG. 1 is configured to create integrated circuits. Although certain details will be provided with reference to the components of the semiconductor manufacturing chamber 100 of FIG. 1, it should be understood that other embodiments may include more, less, or different components. The semiconductor manufacturing chamber 100 is a multi-station processing chamber comprising chamber base 105, top surface 110, chamber top 115 and four pedestals 120*a-d*. It will be understood that four pedestals are shown for illustration only and that chamber 100 may include any number of pedestals. Each pedestal 120*a-d* is positioned within a corresponding well 125*a-d* and includes a showerhead (not illustrated for clarity). The combination of well 125, pedestal 120 and showerhead forms a station in chamber 100.

Figure 2:
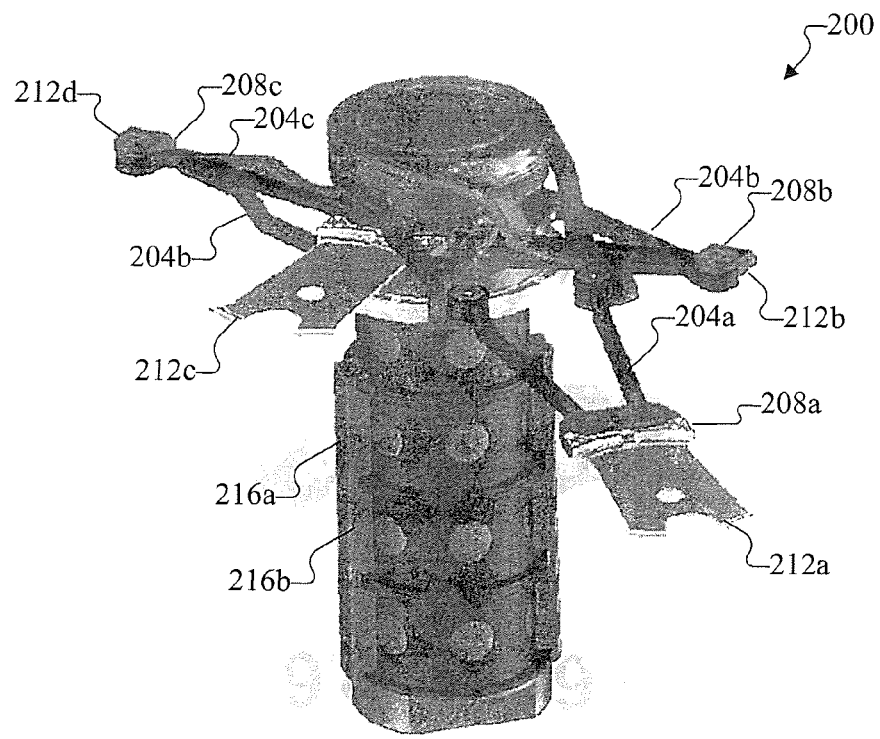
FIG. 2 illustrates a semiconductor manufacturing robot used in semiconductor manufacturing according to embodiments of the present disclosure.

FIG. 2 illustrates semiconductor manufacturing robot 200 according to embodiments of the present disclosure. The semiconductor manufacturing robot 200 of FIG. 2 is configured to be used in semiconductor manufacturing. Although certain details will be provided with reference to the components of the semiconductor manufacturing robot 200 of FIG. 2 it should be understood that other embodiments may include more, less, or different components. Robot 200 includes arms 204*a-d*, wrists 208*a-d*, blades 212*a-d*, rings 216*a* and 216*b*, and other moving parts. One or more of the Robot 200 includes arms 204*a-d*, wrists 208*a-d*, blades 212*a-d*, rings 216*a* and 216*b*, and other moving parts include materials configured to enable defect detection.

Figure 3:
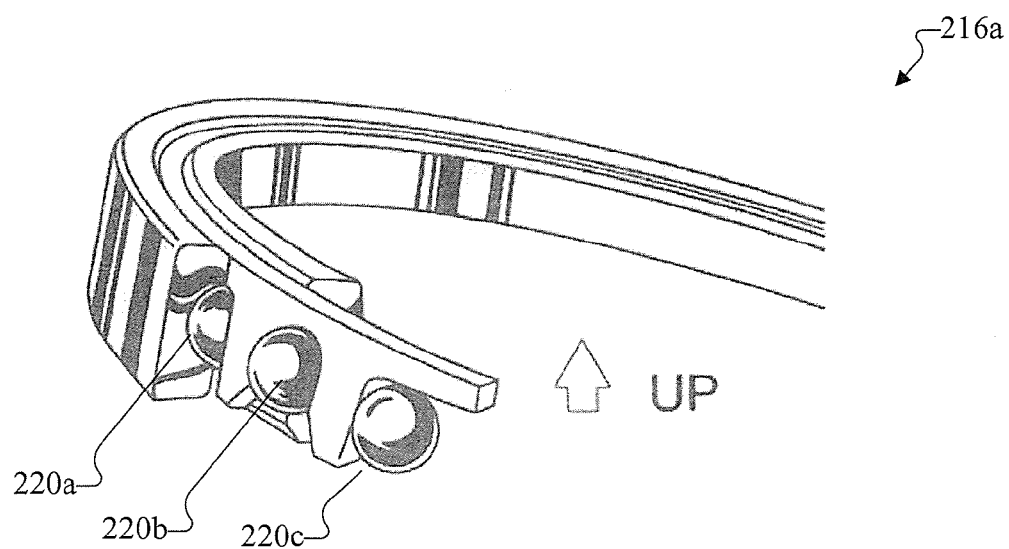
FIG. 3 illustrates a ring of a robot according to embodiments of the present disclosure.

FIG. 3 illustrates a ring of a robot according to embodiments of the present disclosure. The embodiment of the ring 216a shown in FIG. 3 is for illustration only. Other embodiments could be used without departing from the scope of this disclosure. The ring 216a includes a plurality of bearings 220a-c. One or more of the ring 216a and the bearings 220a-c include materials configured to enable defect detection.

During processing, robot 200 moves semiconductor wafers from a first station to a second station and so forth, such that each wafer is sequentially moved through and processed by each station of chamber 100 (shown in FIG. 1).

As robot 200 moves the wafers from a station to a next station during processing, the parts of robot 200 are subjected to wear and tear due to friction. After extended use, the parts typically shed particles which eventually cause defects in the parts. For these reasons, the parts are periodically monitored for defects. One well known method requires elemental analysis of the shed particles. The particles are scanned to trace defect sources. Although elemental analysis provides spatial signatures that can provide clues to potential defect sources, the information obtained from elemental analysis is often insufficient to identify the defect sources. For example, a robot may have multiple components having same material composition, which makes it difficult to pin-point the defect sources from analysis of shed particles. That is, the shed particles may have originated from any of a number of components in the robot. Consequently, after elemental analysis of the particles, the robot is typically disassembled and the parts are physically examined to identify the defect sources. It will be appreciated that disassembling the robot and physically examining the parts are time consuming and causes the robot to remain unproductive for an extended period of time.

According to certain embodiments, rare earth elements (REEs) are implanted or embedded as trace elements in components and parts of semiconductor manufacturing equipments to provide improved defect tracing. The components and parts may, for example, include rings, isolation valves, bellows, robot blades, bearings, robot arms, robot wrists, etc. Certain embodiments provide methods of manufacturing semiconductor processing equipments with trace elements to enable detection.

REEs, when used as trace elements in components and parts of semiconductor processing equipment, improve detection accuracy of defect sources. Additionally, REEs reduce the time required to detect defect sources and reduce the time semiconductor processing equipments remain unproductive.

According to certain embodiments, one or more components and parts of semiconductor processing equipment may be coated with REEs as trace elements. In certain embodiments, one or more components and parts of semiconductor processing equipment are formed using REEs.

Use of REEs as trace elements in components and parts provide numerous advantages. As components and parts shed particles due to friction and wear and tear, REEs appear in the shed particles. The presence of REEs in the shed particles allows early detection of part wear. In addition, the REEs enable faster detection of defect sources after equipment failure.

According to certain embodiments, the REEs used as trace elements include one or more of: Terbium, Iridium, Lutetium, Rhodium or other readily identifiable or unique elements. That is, the trace elements can be comprised of materials, such as REEs, not typically found in the components for the manufacturing environment but which are also not harmful to the semiconductor manufacturing process. Different components or parts of a semiconductor processing equipment can be implanted or embedded with different REEs to allow for fast identification of the source. Alternatively, components or parts of an equipment can be implanted or embedded with combinations of REEs that are unique for each component or part.

For example, the components or parts of a semiconductor equipment can be implanted or embedded such that:
1) Rings 216a and 216b are embedded with Type 1 REE;
2) Valves are embedded with Type 2 REE;
3) Robot blades 212a-d embedded with Type 3 REE; and
4) Robot Wrists 208a-d are embedded with Type 4 REE.

Alternatively, the components or parts of the semiconductor equipment may be implanted or embedded as follows:
1) Rings 216a and 216b are embedded with Type 1 and Type 4 REEs respectively;
2) Valves are embedded with Type 1 and Type 3 REEs;
3) Robot blades 212a-d embedded with Type 2 and Type 3 REEs; and
4) Robot wrists 208a-d are embedded with Type 3 and Type 4 REEs.

It will be appreciated that numerous other combinations of REEs may be used as trace elements to allow for fast identification of the source. For example, the parts may be implanted or embedded with combinations of REEs wherein the percentage of REEs varies from part to part. Thus, the parts may be embedded as follows:

Rings 216a and 216b are embedded with 0.02% Type 1 REE and 0.001% Type 4 REE;
Valves are embedded with 0.06% Type 1 REE and 0.01% Type 3 REE;
Robot blades 212a-d embedded with 0.001% Type 2 REE and 0.006% Type 3 REE;
Robot wrists 208a-d are embedded with 0.002% Type 3 REE and 0.008% Type 4 REE.

In certain embodiments, each component includes a different type of REE, a REE unique to that component, a different or unique composition percentage of REEs, or a combination of the above. For example, the rings 216a-b can be comprised of a Type 2 REE while the bearing 220a-c include a percentage of Type 2 REE and a percentage of Type 3 Ree. The presence of the Type 2 REE indicates a defect in the rings 216a-b or bearings 220a-c. Since the bearings 220a-c are included in the rings 216a-b, a quicker identification of defect and subsequent repair can be accomplished. In another example, the first ring 216a includes a Type 2 REE while the second ring 216b includes a Type 3 REE. The bearings 220a-c in the first ring 216a include a percentage of Type 2 REE and another type of REE, which may or may not be the Type 3 REE, while the bearings 220a-c in the second ring 216b include a percentage of Type 3 REE and another type of REE, which may or may not be the Type 2 REE. The presence of the Type 2 REE indicates a defect in the first ring 216a or bearings 220a-c in the first ring 216a. Since the bearings 220a-c are included in the rings 216a-b, a quicker identification of defect and subsequent repair can be accomplished.

Since REEs are not commonly found in nature and are generally rare, presence of REEs in shed particles indicate that the REEs have been added as trace elements, thus allowing fast and accurate identification of the source. Furthermore, since REEs are chemically inert, presence of REEs in components and parts do not cause chemical reaction with gases, chemicals and other materials during semiconductor processing.

Figure 4:
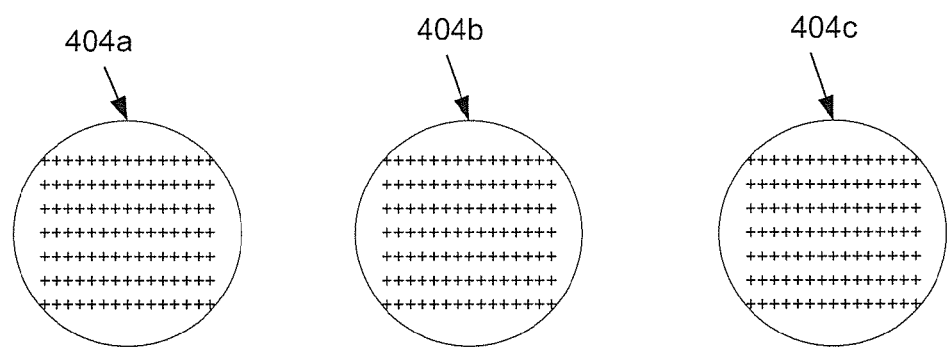
FIG. 4 illustrates bearings of a robot according to embodiments of the present disclosure.

FIG. 4 illustrates exemplary bearings 404a-c according to disclosed embodiments. The embodiments of the bearings 404a-c shown in FIG. 4 are for illustration only. Other embodiments could be used without departing from the scope of this disclosure.

Bearings 404a-c can, for example, be made from stainless steel or ceramic. The bearings 404a-c are implanted or embedded with a REE or composition of REEs. For example, bearings 404a-c can be implanted or embedded with 0.02% Type 1 REE and 0.001% Type 2 REE as trace elements.

Figure 5:
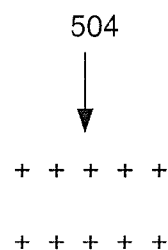
FIG. 5 illustrates particles shed by bearings according to embodiments of the present disclosure.

FIG. 5 illustrates shed particles according to embodiments of the present disclosure. The embodiment of the shed particles shown in FIG. 5 is for illustration only. Other embodiments could be used without departing from the scope of this disclosure.

Due to extended use that subjects bearings 404a-c (shown in FIG. 4) to friction and wear and tear, particles 504 (shown in FIG. 5) are shed by the bearings 404a-c. Elemental analysis is performed on the shed particles 504 which indicate bearings 404a-c as the source of the particles. Thus, the presence of REEs as trace elements allows fast detection of the defect source. Likewise, other components and parts of a semiconductor processing equipment may be implanted or embedded with one or more REEs as trace elements to allow fast detection of a defect source.

Figure 6:
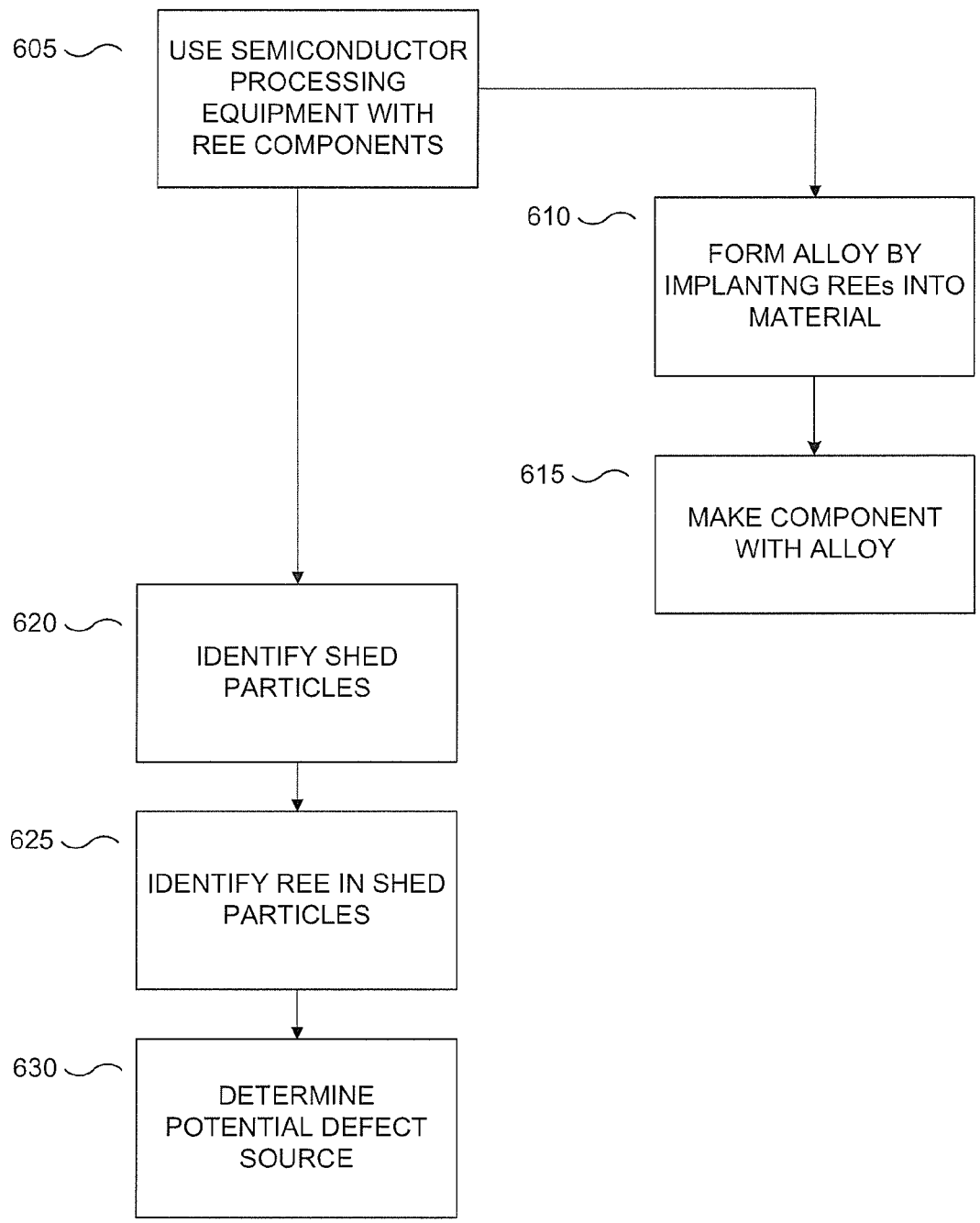
FIG. 6 illustrates a flowchart of a process according to embodiments of the present disclosure.

FIG. 6 illustrates a process for defect detection according to embodiments of the present disclosure. In block 605, a semiconductor processing equipment is used to manufacture semiconductor components. The semiconductor processing equipment includes one or more components having REEs implanted or embedded therein. According to certain embodiments, the component of the semiconductor processing equipment is manufactured by forming an alloy. The allow can include one or more materials such as, for example, stainless steel, carbon, ceramic, aluminum, or titanium which are used to make components and parts of an equipment. The alloy also includes predetermined quantity of one or more selected REEs. The alloy can be implanted or embedded with the selected REEs. By way of example, the alloy can include 0.01% Type 1 REE and 0.003% Type 2 REE. Since REEs are not commonly found in nature and are generally rare, presence of REEs in shed particles indicate that the REEs have been added as trace elements, thus allowing fast and accurate identification of the source. Furthermore, since REEs are chemically inert, presence of REEs in components and parts do not cause chemical reaction with gases, chemicals and other materials during semiconductor processing. The alloy is then formed or shaped into the component.

In certain embodiments, a method of manufacturing the semiconductor processing equipment includes forming respective alloys for components and parts of the equipment. The alloys can include predetermined quantity of one or more REEs. For example, the alloy for a first component may include 0.003% Type 1 REE and 0.02% Type 2 REE. The alloy for a second component may include 0.001% Type 3 REE and 0.005% Type 4 REE. The alloys are then shaped or formed to make the components.

In block 610, an alloy is formed. The allow includes one or more materials such as, for example, stainless steel, carbon, ceramic, aluminum, or titanium, which are used to make components and parts of an equipment. The alloy also includes a predetermined quantity of one or more selected rare earth elements (REEs). By way of example, the alloy can include 0.01% Type 1 REE and 0.003% Type 2 REE. In block 615, the alloy is formed or shaped into the component. It will be understood that the percentages shown are for illustration only and other percentages of the REEs could be used without departing from the scope of this disclosure.

The semiconductor processing equipment moves semiconductor wafers from a station to a next station during processing. One or more parts of semiconductor processing equipment are subjected to wear and tear due to friction.

In block 620, after extended use, the one or more components shed particles which eventually cause defects in the components. The shed particles, which have separated from the component, are deposited in and around the semiconductor processing equipment.

In block 620, the shed particles are identified. The particles are analyzed or scanned to identify the composition of the particles. That is, an analysis is performed to determine if any REEs are present.

In block 625, the REEs are identified. That is, if REES are present in the analysis in block 620, the type of the REEs present in the shed particles are identified. In certain embodiments, the percent composition of the REEs is identified.

In block 630, the defect source is identified. The identified REEs are correlated to respective components in the semiconductor processing equipment. The analysis of the shed particles identifying the REEs present provides unique signatures that indicate which ones of the components in the semiconductor processing equipment are potential defect sources. For example, the identified REEs can be compared to a listing of which components contain the identified REEs or identified percentages of REEs.

Although various features have been shown in the figures and described above, various changes may be made to the figures. For example, the size, shape, arrangement, and layout of components shown in FIGS. 1 through 5 are for illustration only. Each component could have any suitable size, shape, and dimensions, and multiple components could have any suitable arrangement and layout. Also, various components in FIGS. 1 through 5 could be combined, further subdivided, or omitted and additional components could be added according to particular needs. Further, each component in a device or system could be implemented using any suitable structure(s) for performing the described function(s). In addition, while FIG. 6 illustrates various series of steps, various steps in FIG. 6 could overlap, occur in parallel, occur multiple times, or occur in a different order.

The embodiments and examples set forth herein are presented to best explain the present disclosure and its practical application and to thereby enable those skilled in the art to make and utilize the disclosed embodiments. However, those skilled in the art will recognize that the foregoing description and examples have been presented for the purpose of illustration and example only. The description as set forth is not intended to be exhaustive or to limit the disclosed embodiments to the precise form disclosed. Many modifications and variations are possible in light of the above teaching without departing from the spirit and scope of the following claims.

What is claimed is:

1. A component of a semiconductor manufacturing equipment, the component comprising:
   alloy comprising one or more materials and one or more rare earth elements (REEs), the one or more REEs selected to identify the component as a source of a defect in the semiconductor manufacturing equipment.

2. The component of claim 1, wherein the REEs are implanted or embedded into the alloy.

3. The component of claim 1, wherein the alloy comprises predetermined quantities of respective REEs.

4. The component of claim 3, wherein the predetermined quantities comprise a first percentage of a first REE and a second percentage of a second REE.

5. The component of claim 1, wherein the REEs are selected from a group comprising: Terbium, Iridium, Lutetium, Rhodium.

6. The component of claim 1, wherein the component is one of: a ring, isolation valve, bellows, robot blade, bearing, robot arm, and robot wrist.

7. A semiconductor manufacturing equipment comprising:
a plurality of components, at least one of the plurality of components including one or more trace elements, the component made from an alloy comprising one or more materials, wherein the trace elements comprise one or more rare earth elements (REEs), the one or more REEs selected to identify the component as a source of a defect in the semiconductor manufacturing equipment.

8. The semiconductor manufacturing equipment of claim 7, wherein the REEs are implanted or embedded into the alloy.

9. The semiconductor manufacturing equipment of claim 7, wherein the alloy comprises predetermined quantities of the respective REEs.

10. The semiconductor manufacturing equipment of claim 9, wherein the predetermined quantities comprise a first percentage of a first REE and a second percentage of a second REE.

11. The semiconductor manufacturing equipment of claim 7, wherein the REEs are selected from a group comprising: Terbium, Iridium, Lutetium, Rhodium.

12. The semiconductor manufacturing equipment of claim 7, wherein the component is one of: a ring, isolation valve, bellows, robot blade, bearing, robot arm, and robot wrist.

13. The semiconductor manufacturing equipment of claim 7, wherein a first component comprises a first REE and a second component comprises a second REE, the first REE different from the second REE.

14. A method for identifying a defect in a semiconductor manufacturing equipment, the method comprising:
identifying particles shed from at least one component of the semiconductor manufacturing equipment, the at least one component formed from an alloy comprising at least one material and one or more selected rare earth elements (REEs);
determining whether at least one REE is present in the identified particles;
when at least one REE is present in the identified particles, identifying the at least one component as a potential defect source based on the at least one REE.

15. The method of claim 14, wherein the at least one component is formed by at least one of implanting REEs into the alloy; and embedding REEs into the alloy.

16. The method of claim 14, wherein the alloy comprises predetermined quantities of the respective REEs.

17. The method of claim 16, wherein the predetermined quantities comprise a first percentage of a first REE and a second percentage of a second REE.

18. The method of claim 14, wherein the REEs are selected from a group comprising: Terbium, Iridium, Lutetium, Rhodium.

19. The method of claim 14, wherein the at least one component is one of: a ring, isolation valve, bellows, robot blade, bearing, robot arm, and robot wrist.

20. The method of claim 14, wherein a first component of the semiconductor manufacturing equipment comprises a first REE and a second component of the semiconductor manufacturing equipment comprises a second REE, the first REE different from the second REE.

* * * * *